(12) United States Patent
Hewett et al.

(10) Patent No.: US 6,784,001 B2
(45) Date of Patent: Aug. 31, 2004

(54) AUTOMATED VARIATION OF STEPPER EXPOSURE DOSE BASED UPON ACROSS WAFER VARIATIONS IN DEVICE CHARACTERISTICS, AND SYSTEM FOR ACCOMPLISHING SAME

(75) Inventors: Joyce S. Oey Hewett, Austin, TX (US); Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 308 days.

(21) Appl. No.: 10/094,117

(22) Filed: Mar. 8, 2002

(65) Prior Publication Data

US 2002/0098605 A1 Jul. 25, 2002

Related U.S. Application Data

(62) Division of application No. 09/766,737, filed on Jan. 22, 2001, now Pat. No. 6,365,422.

(51) Int. Cl.$^7$ ............................................. H01L 21/66
(52) U.S. Cl. ............................ 438/14; 438/15; 438/16; 257/355; 257/372
(58) Field of Search ............................ 438/14, 15, 16; 257/355, 372

(56) References Cited

U.S. PATENT DOCUMENTS

| | | | |
|---|---|---|---|
| 5,943,550 A | 8/1999 | Fulford, Jr. et al. | 438/14 |
| 6,148,239 A | 11/2000 | Funk et al. | 700/1 |
| 6,154,270 A | 11/2000 | Ozawa | 355/53 |
| 6,200,726 B1 | 3/2001 | Chen et al. | 430/270.1 |
| 6,222,235 B1 | 4/2001 | Kojima et al. | 257/355 |
| 6,232,639 B1 | 5/2001 | Baker et al. | 257/372 |
| 6,248,602 B1 | 6/2001 | Bode et al. | 438/14 |
| 6,606,171 B1 * | 8/2003 | Renk et al. | 358/475 |
| 6,633,831 B2 * | 10/2003 | Nikoonahad et al. | 702/155 |

FOREIGN PATENT DOCUMENTS

| | | | |
|---|---|---|---|
| EP | 0 685 881 A1 | 12/1995 | H01L/21/66 |
| JP | 58-156938 | 9/1983 | G03F/7/20 |

OTHER PUBLICATIONS

Ackmann et al., "Use of Exposure compensation to improve device performance for speed and binning based on electrical parametric feedback into fabrication design," SPIE vol. 3051, pp. 384–390, 1997.

* cited by examiner

Primary Examiner—John F. Niebling
Assistant Examiner—Olivia T. Luk
(74) Attorney, Agent, or Firm—Williams, Morgan & Amerson, P.C.

(57) ABSTRACT

A novel method and system for fabricating integrated circuit devices is disclosed herein. In one embodiment, the method comprises determining at least one electrical performance characteristic of a plurality of semiconductor devices formed above at least one semiconducting substrate, providing the determined electrical performance characteristics to a controller that determines, based upon the determined electrical characteristics, across-substrate variations in an exposure dose of a stepper exposure process to be performed on at least one subsequently processed substrate, and performing the stepper exposure process comprised of the across-substrate variations in exposure dose on the subsequently processed substrates. The system comprises a metrology tool for determining an electrical performance characteristic of a plurality of semiconductor devices formed above at least one substrate, a controller that determines, based upon the determined electrical performance characteristics, across-substrate variations in an exposure dose of a stepper exposure process to be performed on subsequently processed substrates, and a stepper tool that performs the stepper exposure process comprised of the across-substrate variations in exposure dose on the subsequently processed substrates.

8 Claims, 4 Drawing Sheets

AUTOMATED VARIATION OF STEPPER EXPOSURE DOSE BASED UPON ACROSS WAFER VARIATIONS IN DEVICE CHARACTERISTICS, AND SYSTEM FOR ACCOMPLISHING SAME

This is a divisional of co-pending application Serial No. 09/766,737 filed Jan. 22, 2001 Now U.S. Pat. 6,365,422.

BACKGROUND OF THE INVENTION

1. Field of the Invention

This invention relates generally to semiconductor fabrication technology, and, more particularly, to an automated method of varying stepper exposure dose across the surface of a wafer based upon across wafer variations in device characteristics, and a system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11, such as doped-silicon. The substrate 11 may be doped with either N-type or P-type dopant materials. The transistor 10 may have a doped-polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

When the transistor 10 is operational, i.e., when it is turned "ON" by applying an appropriate voltage to the gate electrode 14, a channel region 17, indicated by dashed lines, will be established in the substrate 11 between the source/drain regions 22. During operation, electrons will flow between the source/drain regions 22 in the channel region 17. The distance between the source/drain regions 22 is generally referred to as the "channel length" of the transistor 10, and it approximately corresponds to the length 27 of the gate electrode 14. Channel length, at least in part, determines several performance characteristics of the transistor 10, such as drive current ($I_d$), leakage currents, switching speed, etc.

As further background, as shown in FIGS. 2 and 3, a plurality of die 13 are fabricated above a surface 15 of a substrate or wafer 11. The die 13 are separated by scribe lines 21. Each of the die 13 contains many thousands of the transistors 10. As shown in FIG. 3, one or more illustrative test structures 23, such as a test transistor 29, are formed in the scribe lines 21 at various locations across the surface 15 of the wafer 11. For purposes of clarity, various process layers that are normally formed above the test structure 23, e.g., conductive lines and conductive contacts formed in layers of insulating material, have been omitted.

A plurality of such illustrative test transistors 29 are subjected to one or more electrical performance tests at various points during the process of forming a completed integrated circuit device on each die 13. For example, after an initial metal contact layer is formed, thereby allowing electrical coupling to the test transistor 29 by probing, the drive current of one or more of the test transistors 29 may be measured. The test transistors 29 are assumed to be representative of the transistors fabricated in the production die 13. Based upon such measurements, predictions may be made as to the performance characteristics of the completed integrated circuit devices formed on the die 13. For example, the measured drive current of one or more of the test transistors 29 may be used to predict the overall operating speed of completed integrated circuit devices.

Based upon the results of various electrical performance tests on the test structures 23 and/or completed integrated circuit devices, the wafer 11 may be considered to be comprised of multiple arbitrarily-defined regions, e.g., a center region 31, a middle region 33, and an edge region 35, in which integrated circuit devices formed therein share similar performance characteristics. The precise boundaries and shapes of these various regions are difficult to define. For example, the center region 31 may be defined by an outer radius 41 that is approximately one-third of a radius 43 of an active area 19. The middle region 33 may be defined by an outer radius 45 that is approximately two-thirds of the radius 43 of the active area 19 and an inner radius that corresponds to the outer radius 41 of the center region 31. The edge region 35 may be defined by the outer radius 43 and the inner radius 45. Although the depicted regions 31, 33 and 35 are depicted as having a generally circular or annular ring shape, in practice, they may be of any shape, e.g., oval, toroidal, etc., depending upon the results of the electrical testing.

Based upon experience, the electrical characteristics, e.g., drive current ($I_d$), of the transistors 10 tend to vary across the surface 15 of the wafer 11. For example, the transistors 10 fabricated in the edge region 35 of the wafer 11 tend to have smaller drive currents ("edge-cold") as compared to the transistors 10 fabricated in other regions of the wafer, e.g., the center region 31. Stated another way, the wafer 11 tends to exhibit certain across wafer performance characteristic "signatures," like producing the transistors 10 with reduced drive currents in the edge region 35 of the wafer 11.

These across wafer performance variations may be a result of a variety of processing events. For example, such variations may be due to variations in manufactured gate lengths 27 across the surface of the wafer 11. Alternatively, these performance variations may be due to variations in the results of anneal processes performed on the transistors 10 fabricated in the edge region 35 of the wafer 11 as compared to, for example, the impact of such anneal processes on the transistors 10 fabricated in the center region 31. These variations may also be due to the inherent nature of fabricating the transistors 10 on the edge region 35 of the wafer 11, or they may be due to the particular processing tools used to fabricate the transistors 10 on the wafer 11.

Irrespective of the cause of such across wafer variations, such variations tend to be problematic in that the manufacturing operations are not as efficient as would otherwise be desired. For example, if it is desired to fabricate a certain number of high speed devices, additional wafers may have to be processed due to the fact that a certain number of devices manufactured in the center region 31 of the wafer 11 may have less than desirable performance characteristics, i.e., the operating speed of such transistors may be too slow. Thus, there is a need for an automated method and system of fabricating integrated circuit devices wherein variations in across wafer performance characteristics are reduced or eliminated.

The present invention is directed to solving, or at least reducing the effects of, some or all of the aforementioned problems.

SUMMARY OF THE INVENTION

The present invention is directed to a novel method of fabricating integrated circuit devices, and a system for accomplishing same. In one illustrative embodiment, the method comprises determining at least one electrical performance characteristic of a plurality of semiconductor devices formed above at least one semiconducting substrate, providing the determined electrical performance characteristics to a controller that determines, based upon the determined electrical characteristics, across-substrate variations in an exposure dose of a stepper exposure process to be performed on at least one subsequently processed substrate, and performing the stepper exposure process comprised of the across-substrate variations in exposure dose on the subsequently processed substrates. Through use of the present invention, the exposure dose may be varied on a flash-by-flash basis to compensate for deficiencies in device performance as reflected by the electrical tests.

In one embodiment, the system comprises a metrology tool for determining an electrical performance characteristic of a plurality of semiconductor devices formed above at least one substrate, a controller that determines, based upon the determined electrical performance characteristics, across-substrate variations in an exposure dose of a stepper exposure process to be performed on subsequently processed substrates, and a stepper tool that performs the stepper exposure process comprised of the across-substrate variations in exposure dose on the subsequently processed substrates.

BRIEF DESCRIPTION OF THE DRAWINGS

The invention may be understood by reference to the following description taken in conjunction with the accompanying drawings, in which like reference numerals identify like elements, and in which.

Figure 1:
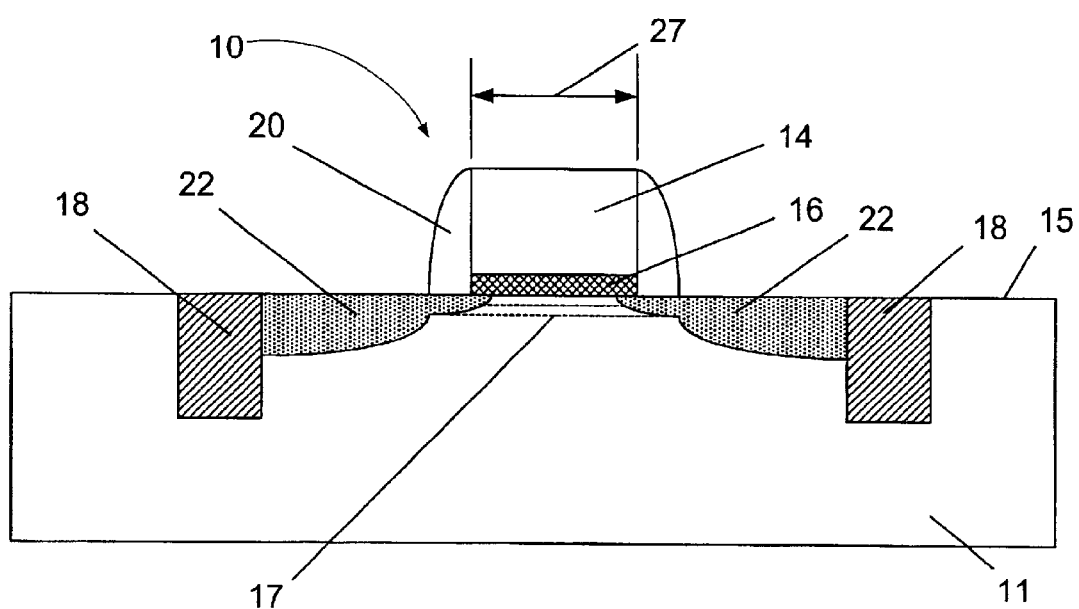
FIG. 1 is a cross-sectional view of an illustrative prior art transistor.
Figure 2:
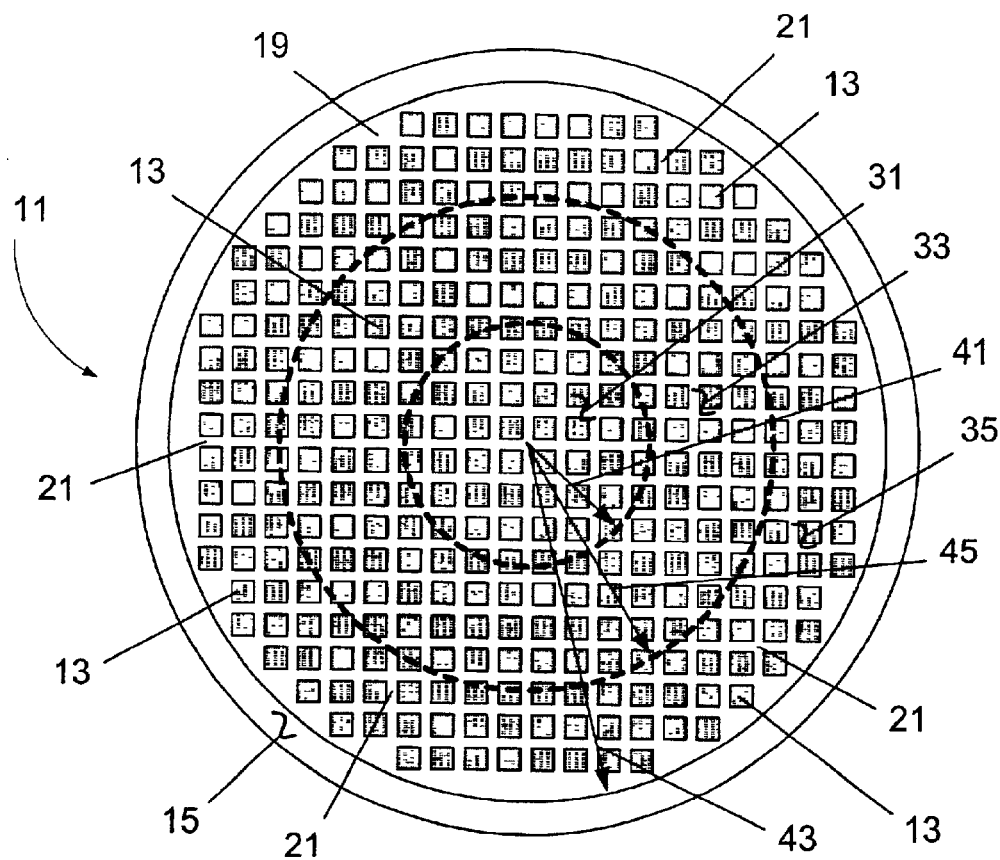
FIG. 2 is a top view of an illustrative wafer having a plurality of die formed thereabove.
Figure 3:
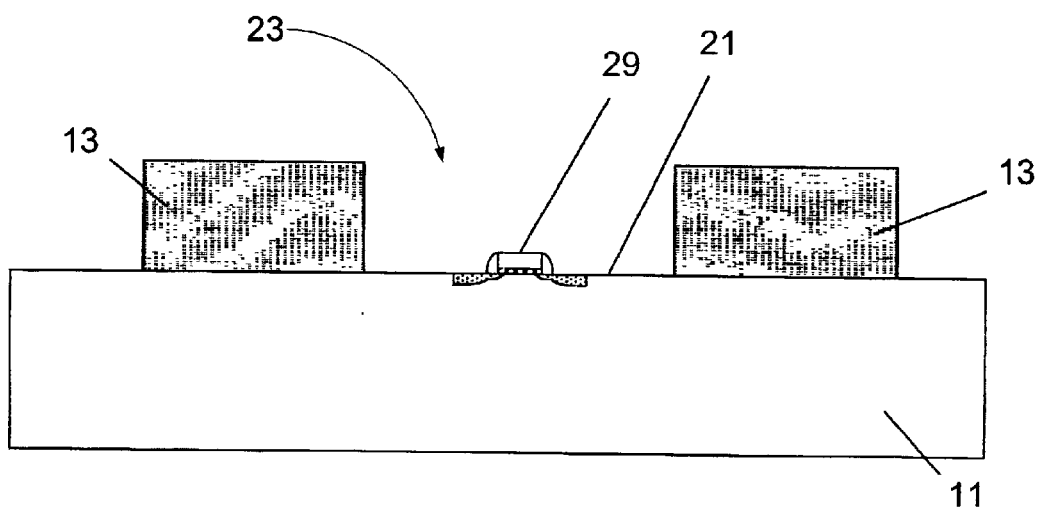
FIG. 3 is a cross-sectional side view of a portion of the wafer showing a test transistor fabricated in a scribe line of the wafer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to an automated method and system for varying stepper exposure dose to compensate for variations in across wafer device performance. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

In semiconductor manufacturing operations, multiple test structures 23, e.g., test transistor structures 29, are formed in the scribe lines 21 of the wafer 11. In general, the scribe lines 21 are lines used to separate the individual die 13 on the wafer 11. Ultimately, the wafer 11 will be sawed along the scribe lines 21, resulting in individual die or chips that will eventually be packaged and sold. A variety of different types of test structures may be formed in the scribe lines 21 to allow testing of various electrical characteristics of the structure. These tests are performed based upon the assumption that these test structures are representative of, or at least may be used to predict, the electrical characteristics of corresponding structures fabricated on the production die 13.

During the course of manufacturing integrated circuit devices, there may be several electrical performance tests performed on the test structures 23, production devices, e.g., transistors, resistors, etc., fabricated on a production die, and/or on completed integrated circuit devices formed on each die 13. For example, after the first metal layer (not shown) is formed, i.e., after conductive contacts (not shown) are formed that contact the underlying semiconductor device, i.e., so-called "contacts," the test structures 23, e.g., the test transistors 29, fabricated in the scribe lines 21 of the wafer 11 may be subjected to one or more testing procedures. For example, the drive current of such test transistors 29 may be measured. Later, after full metallization, i.e., after the formation of the integrated circuit devices on the die 13 are complete, the test transistor 29 may again be tested for a variety of electrical characteristics. Later yet, after the die 13 are separated, i.e., by sawing along the scribe lines 21, the completed integrated circuit devices on the die 13 may be subject to further testing to confirm certain device performance characteristics, e.g., drive current, power consumption, etc.

Given the desire and need to maximize device performance and production yields, many such test structures 23 are formed at various locations across the surface 15 of the wafer 11. The number, location and type of the test structures 23 fabricated across the wafer 11 may be varied as a matter of design choice. These test structures 23 are analyzed at various points during the production process in an attempt to obtain information about the performance characteristics of the actual production devices, e.g., transistors and/or completed integrated circuit devices, being formed on each die 13. Accordingly, multiple test transistors 29 may be tested to predict the performance of production transistors, and thus the performance of the integrated circuit device, e.g., microprocessor, being fabricated on each die 13. Moreover, the results of testing the various test structures 29 may be analyzed to determine certain regions of the wafer that share certain device performance characteristics. For example, such testing may lead to the conclusion that devices fabricated in the edge region 35 of the wafer 11 tend to have relatively high drive currents. From this information, a signature profile of the wafer 11 may be established wherein various regions of the wafer 11 are observed to have devices with similar performance characteristics.

Semiconductor manufacturing generally involves multiple processes whereby layers of material are formed above a substrate, and portions of those layers are selectively removed until such time as a completed device is formed. Photolithography is one process used in manufacturing semiconducting devices. In general, photolithography involves the process of developing a pattern or mask in a layer of photoresist material that is desired to be transferred to an underlying layer of material, e.g., a layer of polysilicon that is to be patterned to define a plurality of gate electrodes 14.

This may be accomplished by initially depositing a layer of photoresist above a previously formed process layer, e.g., a layer of polysilicon, that is desired to be patterned, and exposing the layer of photoresist to a light source in a stepper tool (not shown). This is accomplished by initially making a reticle or photomask having the desired pattern, as is known in the art. Thereafter, the wafer 11, with the layer of photoresist, is positioned in the stepper, and selected portions of the layer of photoresist are exposed to a light source in the stepper as it moves or "steps" across the wafer 11. In some cases, the stepper may expose multiple die 13 on a single flash, e.g., using a 2×1 or a 2×2 reticle. In any event, the process is carried out until select portions of the photoresist positioned above all of the die 13 on the wafer 11 has been exposed. The exposed layer of photoresist is then developed, whereby the pattern in the photomask is reflected in the layer of photoresist. Thereafter, the underlying process layer is then patterned using known etching techniques and the developed photoresist layer and a mask. Ultimately, additional processes, such as ion implantation processes, are performed to form millions of transistors 10 in each of the production die 13, and to form multiple test structures 23, e.g., the test transistors 29, in the scribe lines 21 of the wafer 11.

Figure 4:
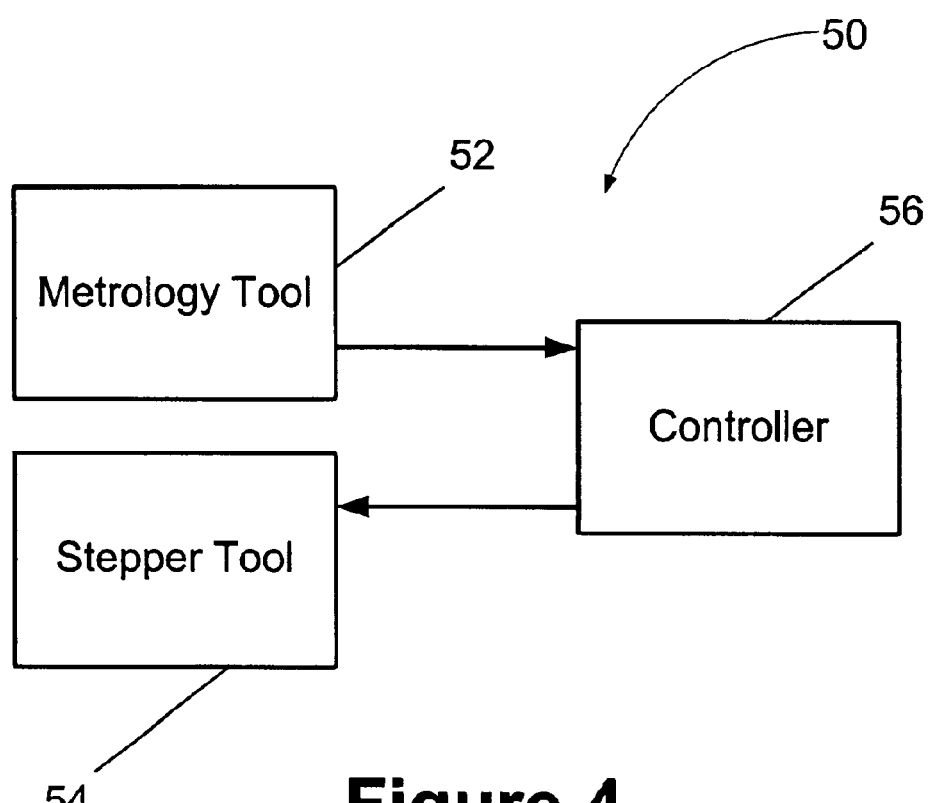
FIG. 4 depicts an illustrative embodiment of a system in accordance with the present invention.

An illustrative system 50 in accordance with one illustrative embodiment of the present invention is depicted in FIG. 4. As shown therein, the system 50 is comprised of a metrology tool 52, a controller 56, and a stepper tool 54. Although a single metrology tool 52 is depicted in FIG. 4, more than one metrology tool 52 may be employed with the present invention. The metrology tool 52 may be any type of tool useful for measuring a performance characteristic of a semiconductor device, such as a test transistor structure, a production device, e.g., a transistor, resistor, etc., on a production die, or a completed integrated circuit device. That is, one or more metrology tools 52 may be used to determine or measure device characteristics on a plurality of the test structures 29, production devices within a die, or completed integrated circuit devices formed on the die 13.

The metrology tool 52 may be used to measure or determine a variety of characteristics of the semiconductor device. For example, the metrology tool 52 may be used to measure or determine characteristics such as the drive current ($I_d$) of NMOS and PMOS transistors, the resistivity of source/drain regions, and, in CMOS technology, the ratio of drive currents for NMOS devices and PMOS devices ($I_{dn+}/I_{dp+}$). With respect to the last performance characteristic, $I_{dn+}/I_{dp+}$, it has been found that one exemplary target value for that parameter, at least for producing microprocessors at AMD, is approximately 2. Variations from that number tends to produce adverse results. For example, as the ratio increases above 2, CMOS devices tend to exhibit higher leakage currents than would be desirable. Lower values for this ratio also produce devices that exhibit high leakage. Leakage current may be minimized by a specific optimal $I_{dn+}/I_{dp+}$ ratio that is characteristic of the transistor and the device design.

In one embodiment, the results of these tests obtained by the metrology tool 52 are then fed back to the controller 56. In turn, the controller 56 may be used to modify or control the exposure dose of the stepper tool 54 when it is used to expose subsequently processed wafers 11. That is, the exposure dose of the stepper tool 54 may be adjusted based upon the measured performance characteristics of the test structures 23 and/or the completed integrated circuit devices formed on the die 13. The adjustment to the stepper tool 54 exposure dose may be varied on a flash-by-flash basis as the tool steps across the wafer 11.

In another illustrative embodiment, a signature characteristic of the wafer 11 may be established based upon the results of the testing of the test structures 23 and/or completed integrated circuit devices. That is, the determined performance characteristics may lead to the identification of various regions of the wafer 11, e.g., the edge region 35, the middle region 33, and/or the center region 31, wherein devices exhibit similar performance characteristics. The identification of the regions may be based upon a variety of test characteristics, e.g., drive current, source/drain resistivity, etc. For example, regions may be identified by establishing an acceptable value, or range of values, for the tested characteristic, and identifying devices that fall below, within or above the acceptable range. The number of regions identified and the shape of those regions are matters of judgment to be determined by the appropriate process engineer based upon sound engineering judgment.

This type of testing or characterization may be performed on any desired number of wafers 11. For example, the testing may be performed on all of the wafers 11 in one or more lots, or on a representative number of the wafers 11 in a given lot, and these test results may then be used to vary the exposure dose of the stepper tool 54 on subsequent wafers 11.

Additionally, more than one lot of wafers may be analyzed until such time as the process engineer has achieved a sufficiently high degree of confidence that the testing accurately reflects across-wafer variations in device characteristics of the devices fabricated using a particular process flow.

The metrology tool 52 may be any type of device useful for measuring the desired characteristic of the devices formed above the wafer 11. For example, an HP 4071 Parametric type tool may be used to measure a drive current of the devices, or an Electroglas 4080X automatic prober type tool may be used to measure the resistivity of the source/drain regions of the devices. Other types of metrology tools 52 known to those skilled in the art may also be used to measure of determine these characteristics, or other desirable characteristics.

In the illustrated embodiment, the controller 56 is a computer programmed with software to implement the functions described herein. Moreover, the functions described for the controller 56 may be performed by one or more controllers spread through the system. For example, the controller 56 may be a fab level controller that is used to control processing operations throughout all or a portion of a semiconductor manufacturing facility. Alternatively, the controller 56 may be a lower level computer that controls only portions or cells of the manufacturing facility. Moreover, the controller 56 may be a stand-alone device, or it may reside on the metrology tool 52 or the stepper tool 54. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 56, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699 Provisional Specification for CIM Framework Domain Architecture) and APC (SEMI E93-0999—Provisional Specification for CIM Framework Advanced Process Control Component) specifications are publicly available from SEMI.

The operation of the illustrative system 50 will now be described. Initially, electrical performance characteristics of a number of the test structures 23 and/or completed integrated circuit devices are determined by the metrology tool 52. These measurements may be made on a number of such devices formed above the wafer 11. Alternatively, these measurements may be made on a selected number of devices within each region of interest of the wafer 11, e.g., the regions 31, 33 or 35. Of course, it is not required that the devices from every region be analyzed. For example, only two regions, e.g., regions 31 and 35, may be of interest. Moreover, although not depicted in the drawings, the wafer 11 may be divided into only two regions.

The precise number of the test structures 23 and/or completed integrated circuit devices analyzed will be a matter of design choice, however, a sufficient number of tests should be performed so as to provide a relatively high degree of confidence that the determined characteristics are representative of devices fabricated within each region or across the wafer 11. For example, nine of the test transistors 29 may be analyzed in each of the regions 31, 33 and 35. The greater the number of test transistors 29 analyzed, the more likely the results will accurately represent the characteristics of the devices formed in that region.

The results obtained or sensed by the metrology tool (or tools) 52 may be provided to the controller 56. The controller 56 then determines if the exposure dose of the stepper tool 54 needs to be changed to compensate for variations in device performance across the surface 15 of the wafer 11. Thereafter, additional wafers are subjected to the stepper process in the appropriate region of the wafer 11 using the newly determined stepper exposure dose. The revised stepper process may be performed on other wafers in the same lot or on wafers in additional lots.

For example, it may be that the testing indicates that devices fabricated in the edge region 35 of the wafer 11 are not as fast as devices fabricated in other regions, e.g., the middle region 33, or otherwise fail to meet desired performance characteristics. In that situation, the exposure dose of the stepper process to be performed on devices fabricated in the edge region 35 of subsequent wafers may be varied to compensate for the performance deficiencies of the devices in the edge region 35, as indicated by the previous tests. That is, irrespective of the cause of the sub-standard performance of devices, the exposure dose of the stepper process used to expose the die 13 in the identified region is adjusted to compensate for the performance deficiencies. For example, if it is determined, based upon the various electrical tests described above, that production transistors in the edge region 35 of the wafer 11 perform at sub-standard levels, i.e., if the switching speeds are slower than a targeted value, then, for subsequently processed wafers, the exposure energy may be increased for the die 13 in that area in an effort to compensate for the performance deficiencies. By increasing the exposure dose of the stepper, the critical dimension ("CD") of the gate electrode 14 for transistors formed in the affected region will be reduced, thereby increasing the operating speed of the device. Similarly, if devices in the middle region 33 exhibit an unacceptably high leakage current, e.g., due to gate lengths 27 being too small, then the exposure dose used in patterning gate electrodes 14 in the middle region 33 may be reduced, resulting in large gate CDs.

Adjustments to the stepper process may be performed on a flash-by-flash basis. As the stepper advances across the wafer 11, the exposure dose of flashes performed in the edge region 35 of the device may be increased relative to the exposure dose used on devices in the middle region 33 of the wafer 11. That is, through use of the present invention, the across wafer exposure dose of the stepper process may be varied based upon the results of various performance tests such that the across wafer variation in device performance is reduced or eliminated. This may be accomplished by a feedback of tested electrical characteristics of the test structures 23, e.g., the test transistors 29, and/or completed integrated circuit devices fabricated across the surface of previously processed wafers, and, based upon that information, varying the exposure dose of the stepper process across the surface of subsequently processed wafers.

Figure 5:
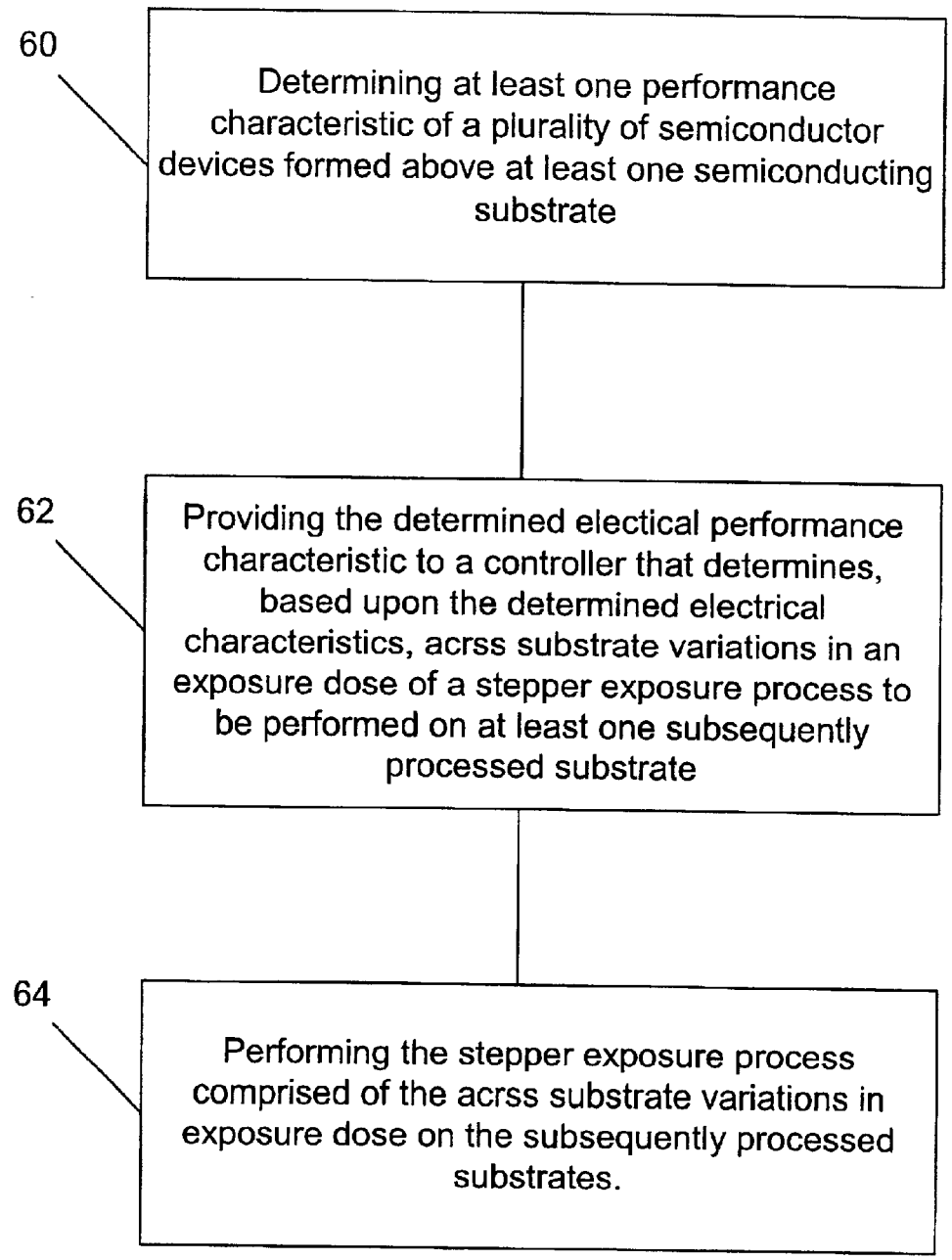
FIG. 5 is a flowchart depicting one illustrative embodiment of the present invention.

The present invention is directed to a novel method of fabricating integrated circuit devices, and a system for accomplishing same. One illustrative embodiment of the method disclosed herein is depicted in flowchart form in FIG. 5. As shown therein, the method comprises determining at least one electrical performance characteristic of a plurality of semiconductor devices formed above at least one semiconducting substrate, as indicated at block 60, and providing the determined electrical performance characteristics to a controller that determines, based upon the determined electrical characteristics, across-substrate variations in an exposure dose of a stepper exposure process to be performed on at least one subsequently processed substrate, as set forth in block 62. The method further comprises performing the stepper exposure process comprised of the across-substrate variations in exposure dose on the subsequently processed substrates, as recited in block 64.

In one illustrative embodiment, the system disclosed herein comprises a metrology tool for determining an electrical performance characteristic of a plurality of semiconductor devices formed above at least one substrate, a controller that determines, based upon the determined electrical performance characteristics, across-substrate variations in an exposure dose of a stepper exposure process to be performed on subsequently processed substrates, and a stepper tool that performs the stepper exposure process comprised of the across-substrate variations in exposure dose on the subsequently processed substrates.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A system, comprising:

a metrology tool for determining an electrical performance characteristic of a plurality of semiconductor devices formed above at least one substrate;

a controller that determines, based upon the determined electrical performance characteristics, across-substrate variations in an exposure dose of a stepper exposure process to be performed on subsequently processed substrates; and a stepper tool that performs said stepper exposure process comprised of said across-substrate variations in exposure dose on said subsequently processed substrates.

2. The system of claim 1, wherein at least some of said plurality of semiconductor devices are comprised of at least one of a transistor, a resistor, a capacitor, a test transistor, and a completed integrated circuit device.

3. The system of claim 1, wherein said electrical performance characteristics are comprised of at least one of a drive current, an operating speed, and a resistance.

4. The system of claim 1, wherein said at least one substrate is comprised of a center region, a middle region, and an edge region.

5. The system of claim 1, wherein said metrology tool is comprised of at least one of an HP 4071 parametric tool and an Electroglas 4080X automatic prober tool.

6. The system of claim 1, wherein said controller is a stand-alone controller.

7. The system of claim 1, wherein said controller is resident on said stepper tool.

8. The system of claim 1, wherein said controller is resident on said metrology tool.

* * * * *